United States Patent [19]

Brugge et al.

[11] Patent Number: 5,282,947
[45] Date of Patent: Feb. 1, 1994

[54] MAGNET ASSEMBLY FOR ENHANCED SPUTTER TARGET EROSION

[75] Inventors: Hunter B. Brugge; Kin-Sang Lam, both of San Antonio, Tex.

[73] Assignee: VLSI Technology, Inc., San Jose, Calif.

[21] Appl. No.: 929,249

[22] Filed: Aug. 13, 1992

[51] Int. Cl.⁵ ............................................. C23C 14/35
[52] U.S. Cl. ................................. 204/298.2; 204/192.12
[58] Field of Search ...................... 204/298.2, 192.12

[56] References Cited

U.S. PATENT DOCUMENTS 5,120,417  6/1992  Takahashi et al. ............... 204/192.12

FOREIGN PATENT DOCUMENTS 61-295369 12/1986 Japan ................................ 204/298.2
63-243271 10/1988 Japan ................................ 204/298.2
63-243272 10/1988 Japan ................................ 204/298.2
2-107765  4/1990 Japan ................................ 204/298.2

Primary Examiner—Aaron Weisstuch
Attorney, Agent, or Firm—Majestic, Parsons, Siebert & Hsue

[57] ABSTRACT

The present invention concerns a magnet assembly for a sputtering chamber that allows for an even erosion of a target in the sputtering chamber so that atoms on the target are deposited on a wafer. This magnet assembly has a side magnet which is thinner than a center and ring magnet. This side magnet's centerplane is positioned above the centerplane of the other magnets. Additionally, this magnet assembly uses a center magnet in the range of substantially 350-450 Gauss and a side magnet of in the range of substantially 680-780 Gauss so that an asymmetrical magnetic field will be created which will cause an even erosion of the target and prevent re-deposition.

13 Claims, 12 Drawing Sheets

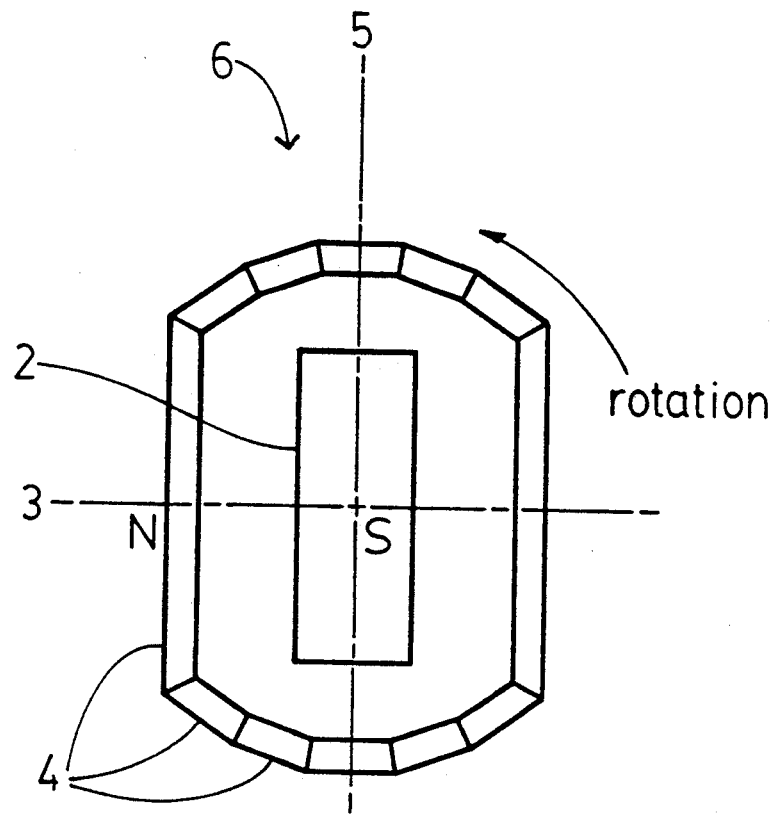
Prior Art
FIG._1.
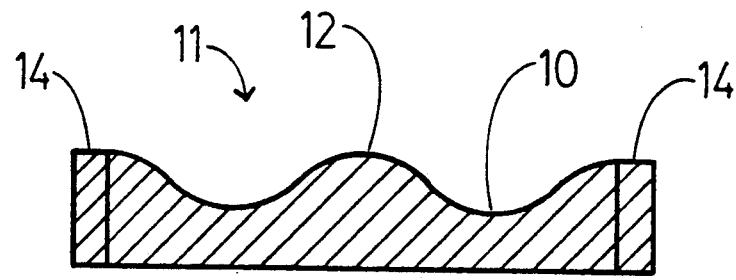
sputter target
Prior Art
FIG._2.

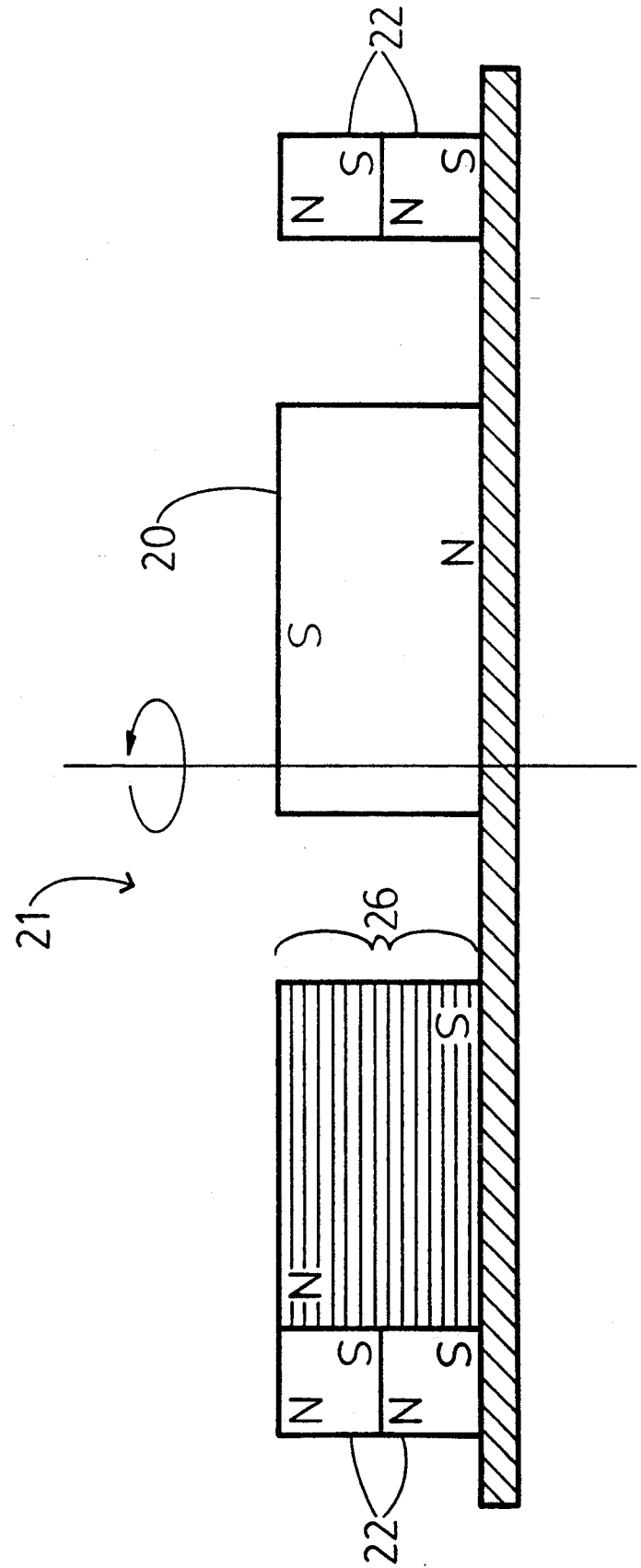
Prior Art
FIG._3(a).

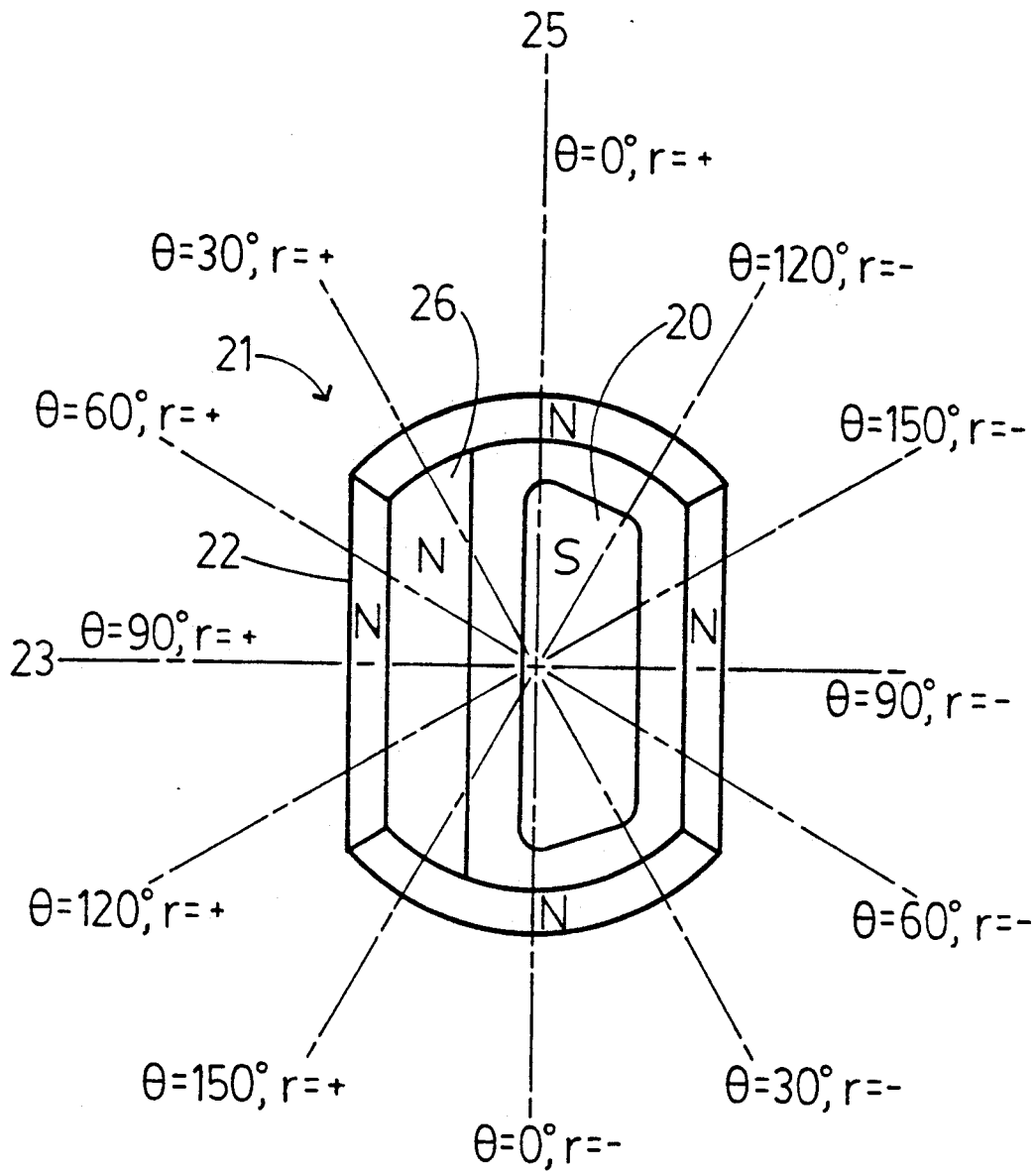
Prior Art
FIG._3(b).

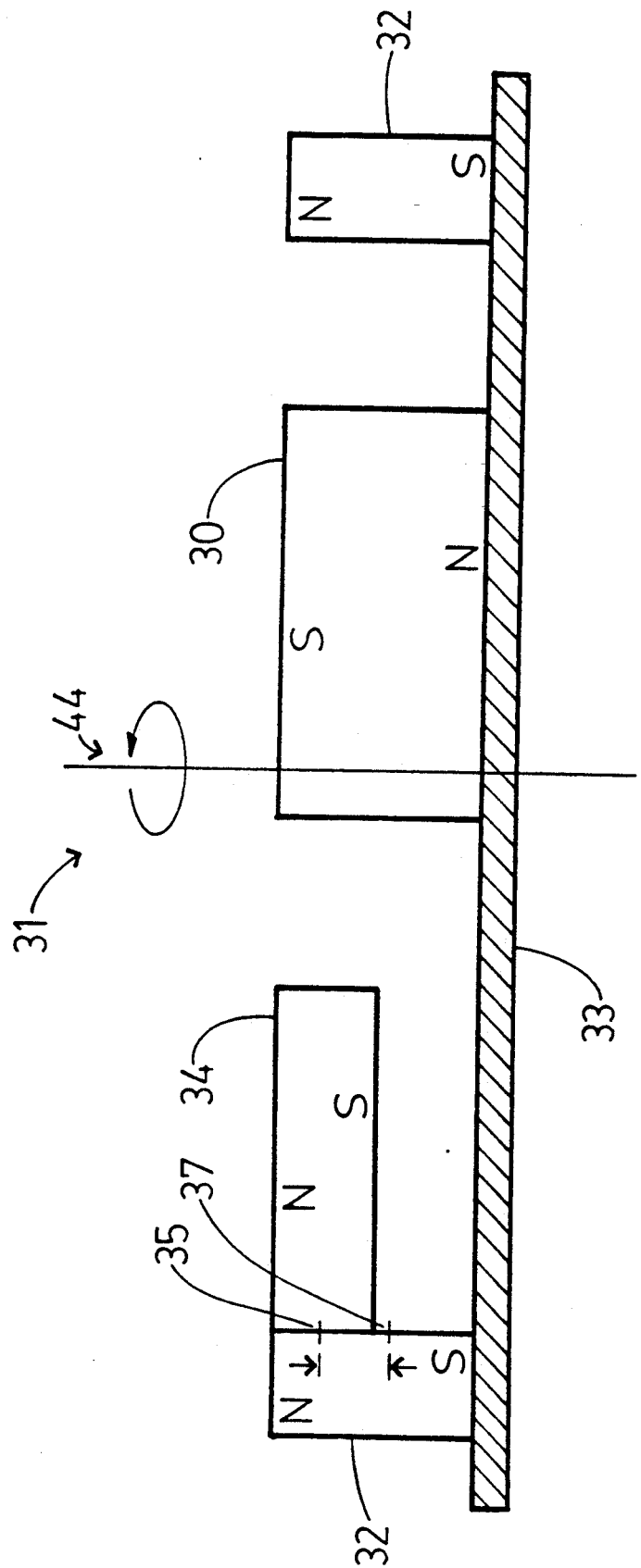
FIG._4.

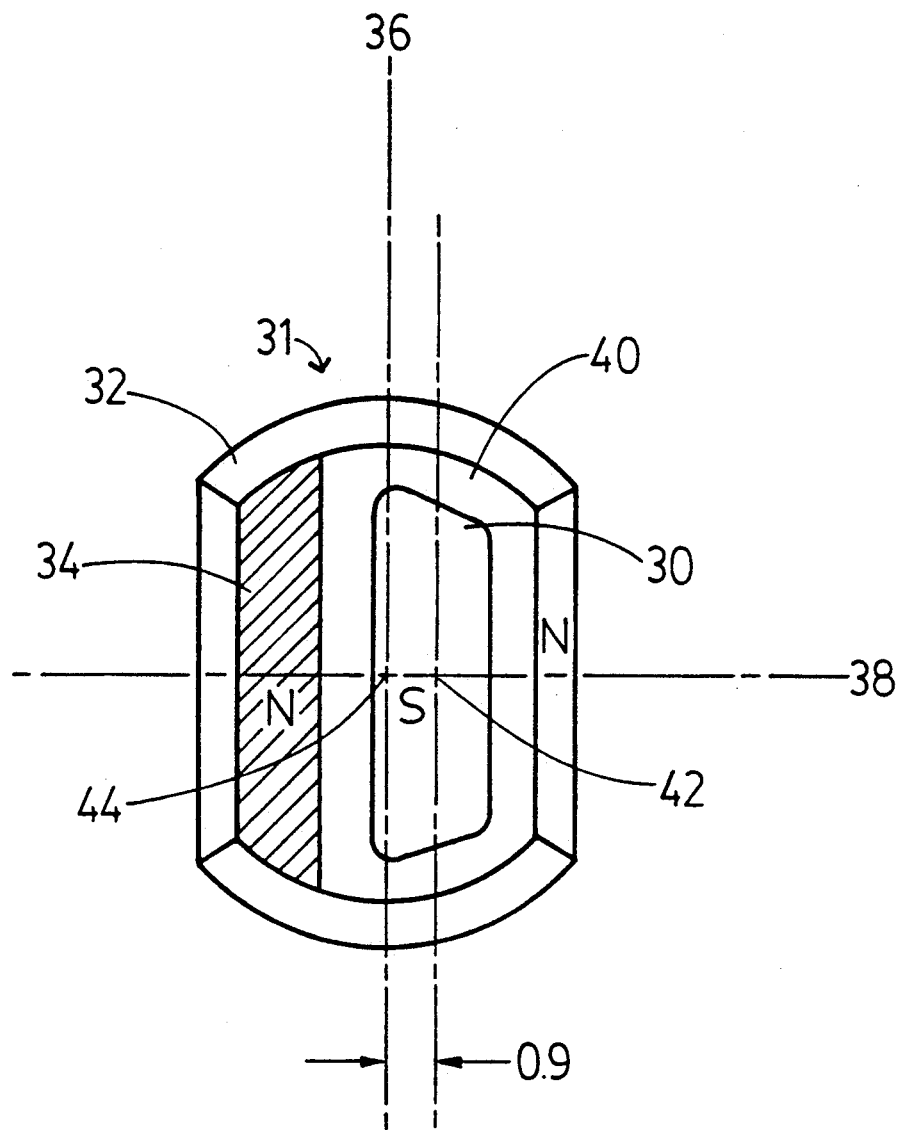
FIG._5.

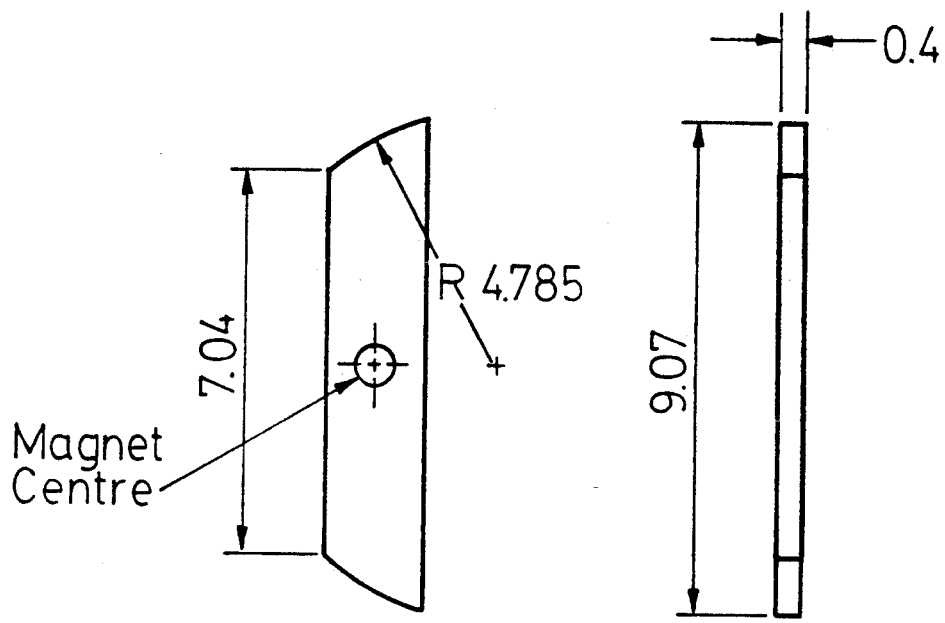
TOP VIEW
FIG.—6(a).
SIDE VIEW
FIG.—6(b).
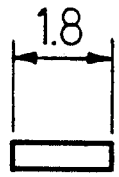
END VIEW
FIG.—6(c).

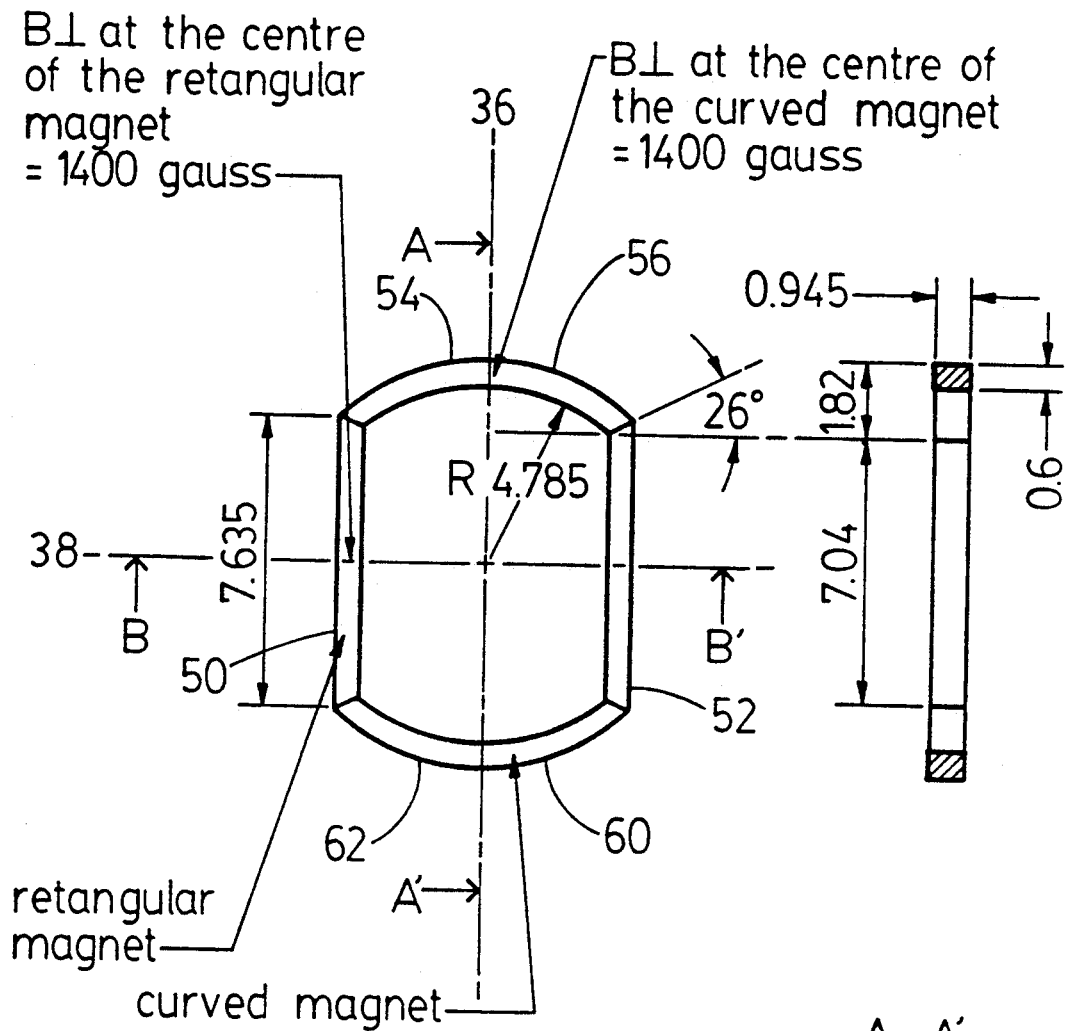
TOP VIEW
FIG.__7(a).
A-A' SECTIONAL VIEW
FIG.__7(b).
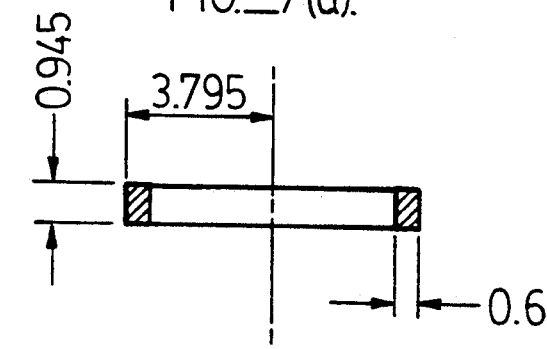
B-B' SECTIONAL VIEW
FIG.__7(c).

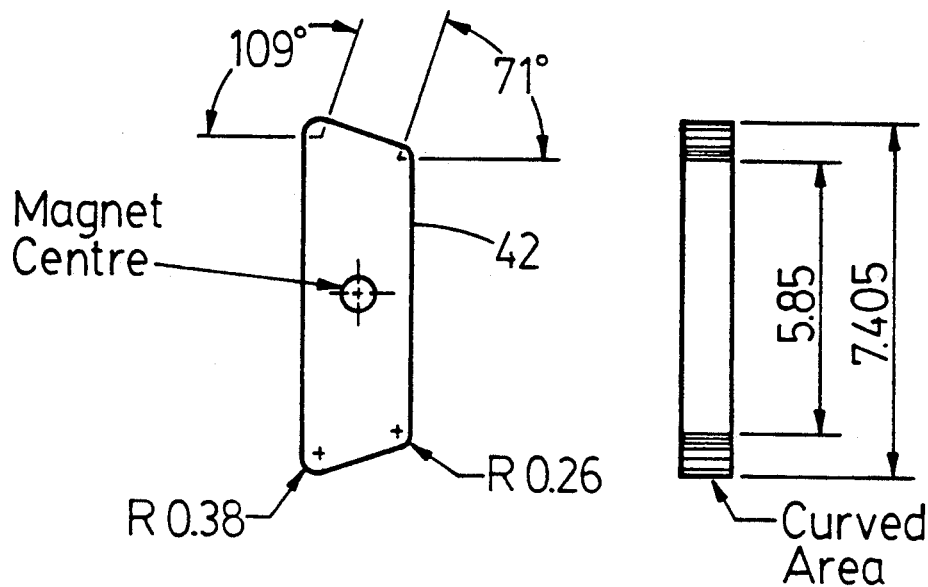
TOP VIEW
FIG 8(a)
SIDE VIEW
FIG 8(b)
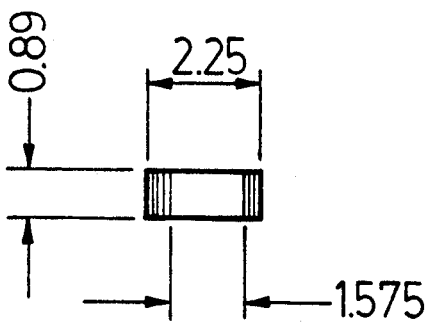
END VIEW
FIG. 8(c).

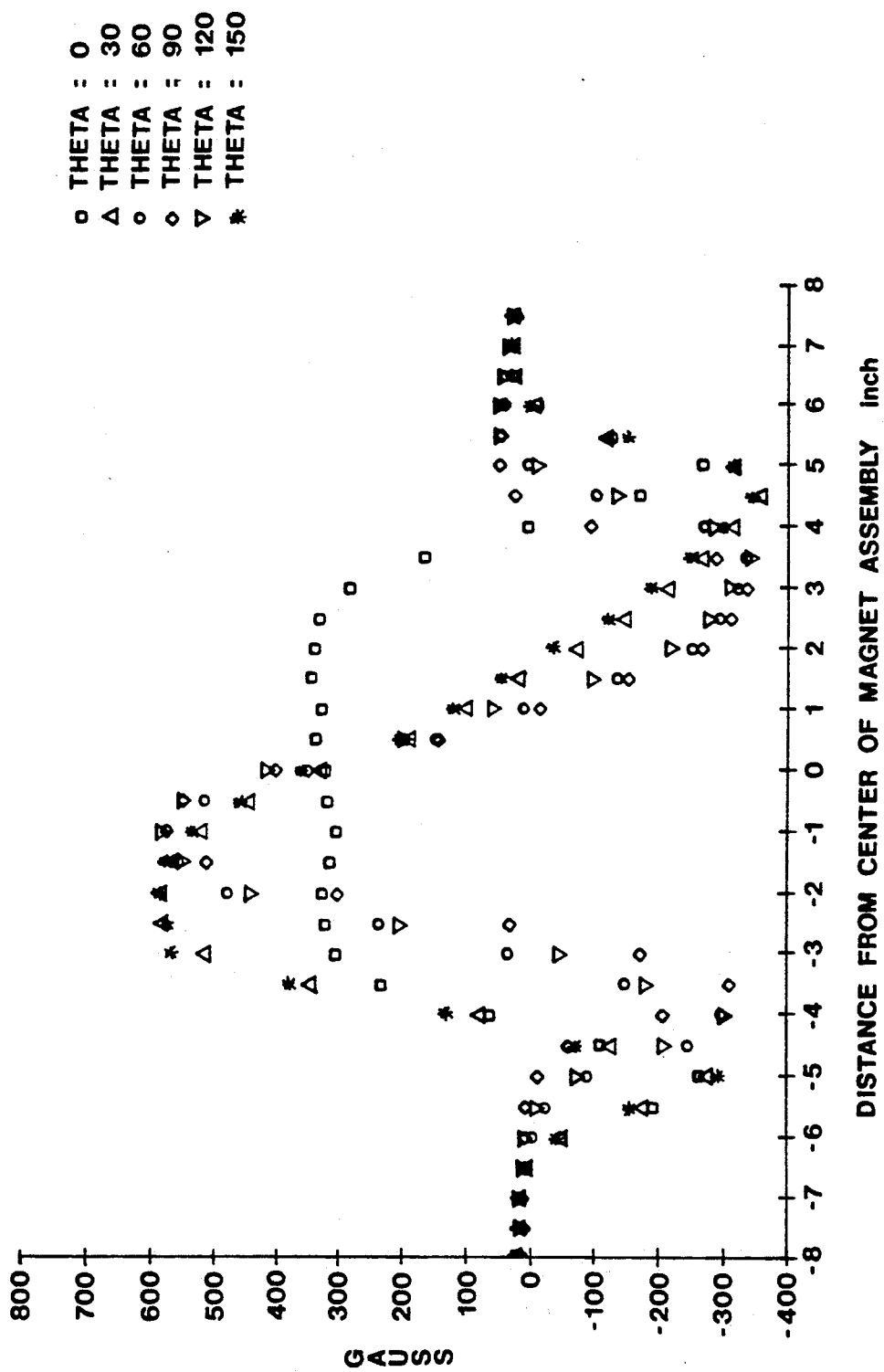
FIG._9(a).

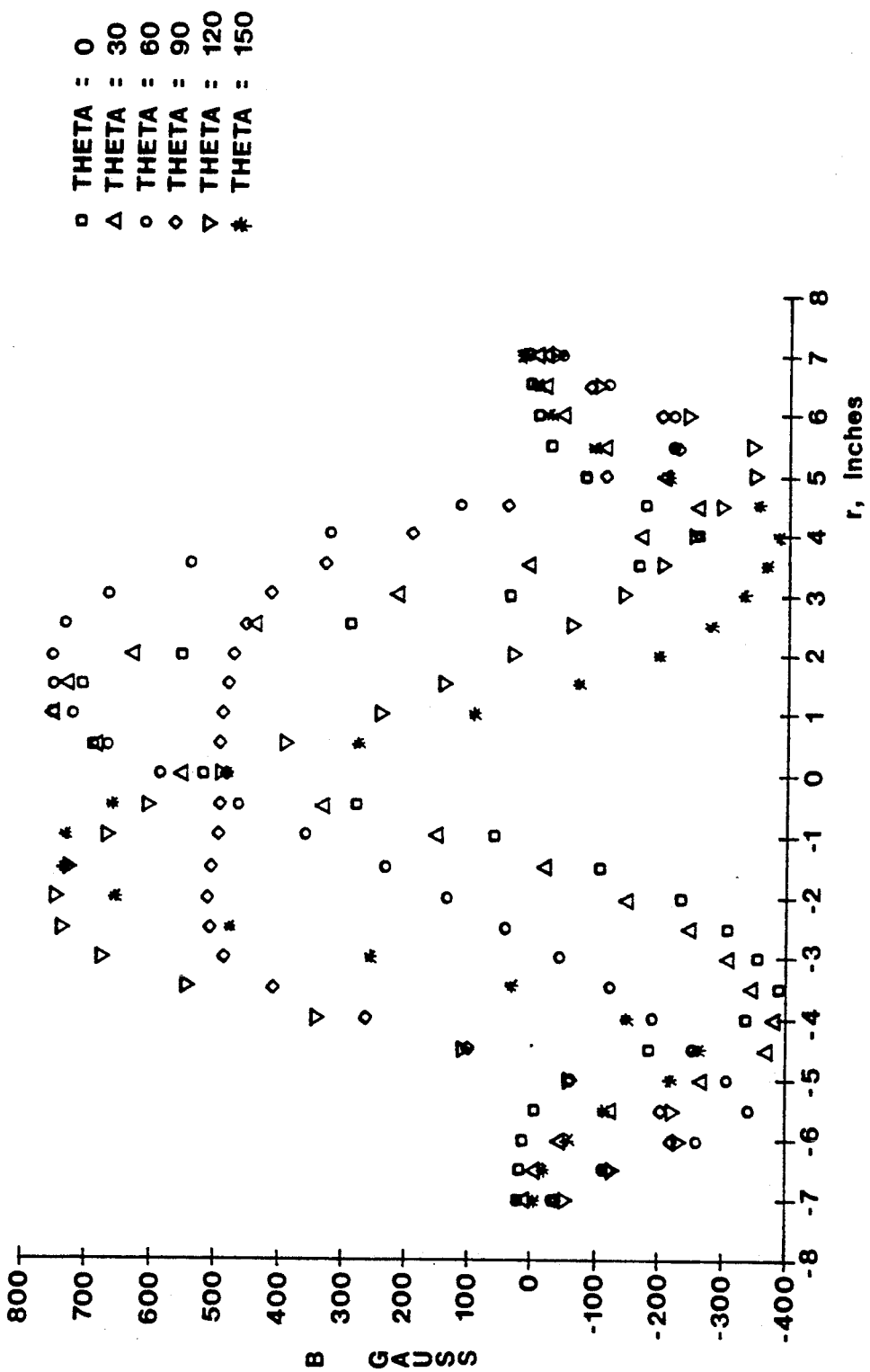
Prior Art
FIG._9(b).

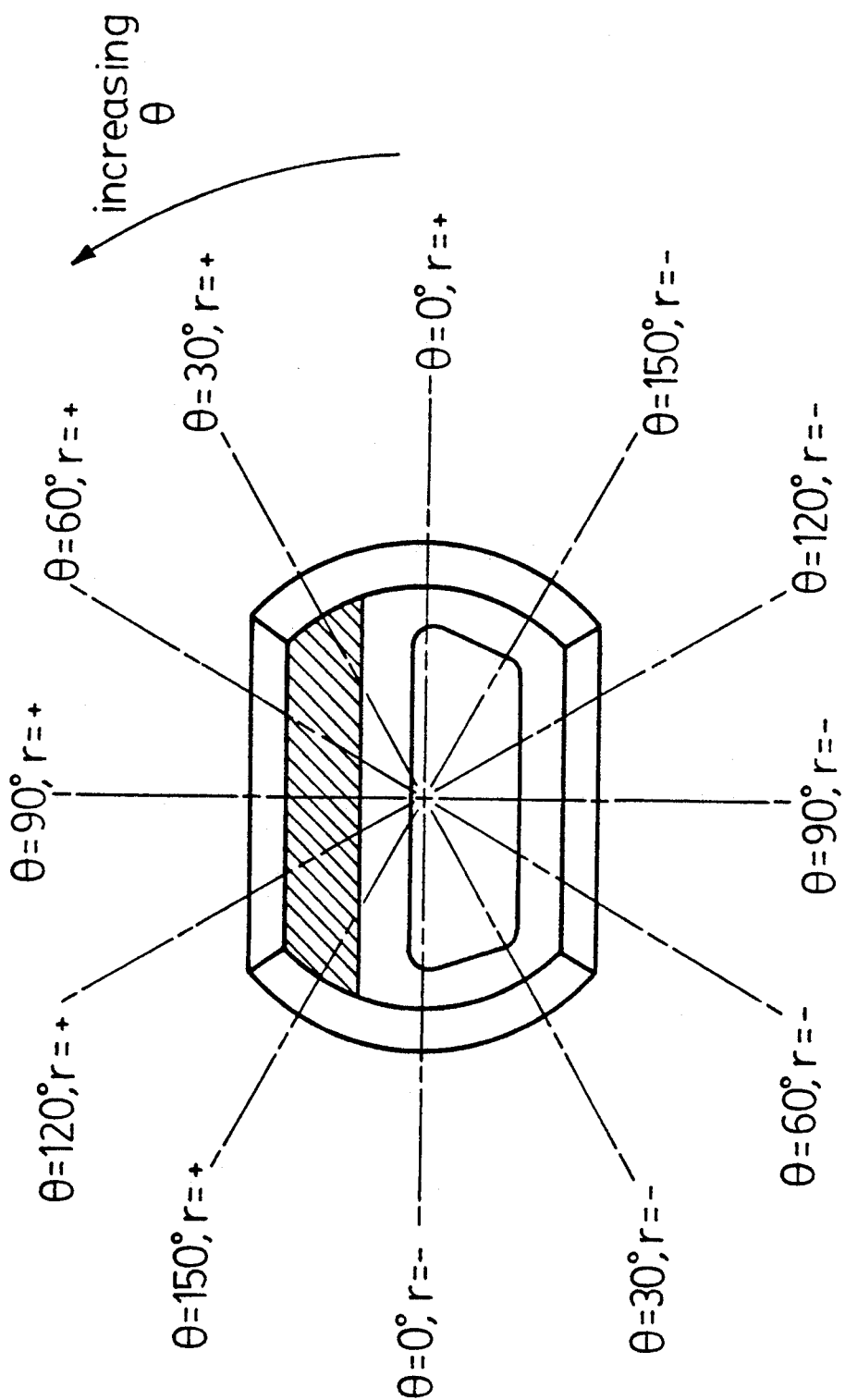
FIG._10.

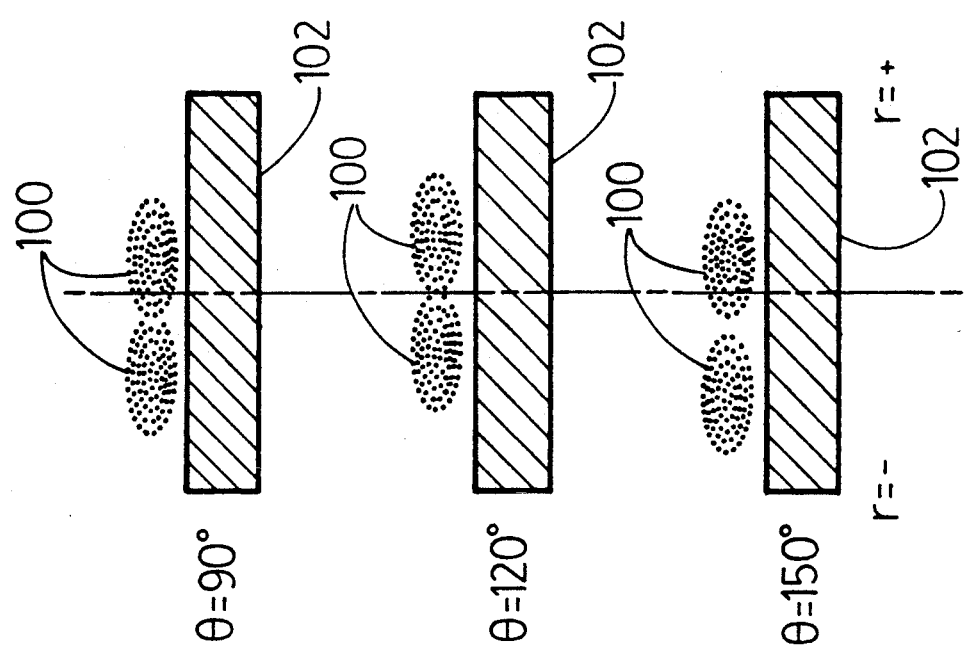
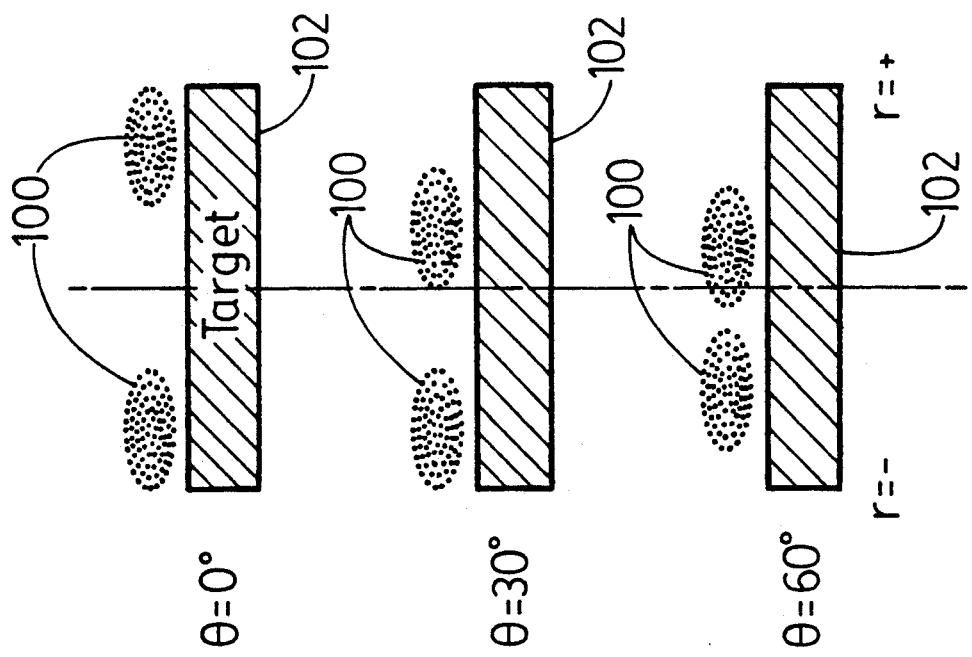
FIG._11.

MAGNET ASSEMBLY FOR ENHANCED SPUTTER TARGET EROSION

BACKGROUND OF THE INVENTION

This invention relates to a magnet assembly used in a sputtering chamber. In sputtering chambers, a magnet assembly is typically used to confine plasma gases in an area on the surface of a target. The transfer of momentum as ions strike the target causes atoms in the target to be ejected from the target and deposit on silicon wafers. The target may be an alloy such as tungsten silicide. The gas in the sputtering chamber during use is at a low pressure and gas ions such as argon gas ions are created to sputter metal from the target. These ions are confined by the magnetic field of a magnet assembly. The magnet assembly rotates behind the target at a rate of about 1 revolution per second so that the plasma sweeps across different areas of the target.

FIG. 1 is a top view of a prior art Anelva PMC magnet assembly which works with targets that are 280 millimeters in diameter. This magnet assembly uses a center magnet 2 which is oriented with the south pole on the top (directly behind the target), and ring magnets 4, which surround the center magnet 2. These ring magnets are oriented with the north on top. The whole magnet assembly 6 is symmetric about the two axes 3 and 5.

FIG. 2 is a cross-sectional view of a sputter target 11 after use with the Anelva PMC magnet assembly shown in FIG. 1. Notice that the target 11 has areas 10 of uneven erosion. This uneven erosion is caused by the plasma being contained over some areas of the target more than other areas of the target during the revolution of the magnet assembly. This uneven erosion is problematic because the metals used in the target are expensive, and any unused metal is wasted. Additionally, re-deposition of metal occurs in area 12. Re-deposition occurs when metal sputtered from a part of the target is re-deposited on other parts of the target. Eventually, as the target is heated up and cooled down through the sputtering process, metal from the re-deposited area 12 may flake off and fall onto the wafer, causing imperfections.

A prior art magnet assembly that has a somewhat more even erosion of the target is shown in the prior art FIGS. 3 (a) and (b). FIG. 3 (a) is a cross-sectional view of the Anelva SPMC magnet assembly. This magnet assembly 21 uses a center magnet 20, thirty-two ring magnets 22 of which four are shown in FIG. 3 (a), and twenty-three rubber side magnets 26. The magnetic field strengths of the ring magnet section 22, the center magnet section 20 and the side magnet section 26 as measured at the surface of these magnet sections are 1550 Gauss, 960 Gauss, and 500 Gauss respectively. The rubber side magnets 26 have the disadvantage that they may become demagnetized if the magnet assembly becomes heated during the sputtering process. Additionally, the Anelva SPMC magnet assembly 21 must be used with a 300 mm diameter target. If the Anelva SPMC magnet assembly is used with smaller targets, the shielding on the sides of the target may be damaged which would contaminate the silicon wafer. Additionally, the sputter target shielding must be re-designed to accommodate the larger diameter target.

FIG. 3 (b) is a top view of the Anelva SPMC magnet assembly 21. The ring section 22 is symmetric across axes 23 and 25. The center magnet section 20 is located asymmetrically with respect to axis 25 and the side magnet 26 is on one side of axis 25.

It is an objective of the present invention to have a magnet assembly that increases efficiency of the target erosion in a sputtering chamber. Another object of the present invention is to have a magnet assembly that erodes the target surface of 280 mm diameter targets in a more even fashion.

SUMMARY OF THE INVENTION

In accordance with the principles of the present invention, the above and other objectives are realized by using a magnet assembly for a sputtering chamber comprising a ring magnet section of a first thickness, the ring magnet section being symmetrical about a first axis and a second axis, the ring magnet section defining a center area; a center magnet section of a second thickness, the center magnet section located within the center area, the center magnet section located asymmetrically to the first axis; and a side magnet section within the center area attached to the ring magnet section and located on one side of the first axis, the side magnet having of a thickness less than the first and second thickness.

Additionally, in accordance with the principles of the present invention, the above and other objectives are realized by using a magnet assembly for a sputtering chamber comprising a ring magnet section symmetrical along a first axis and a second axis, the ring magnet section defining a center area; a center magnet section within the center area defined by the ring magnet section, the center magnet section located asymmetrically to the first axis, the center magnet section having a magnetic field strength in the range of substantially 680–780 Gauss; and a side magnet section within the center area attached to the ring magnet section on one side of the first axis of the ring magnet section, the side magnet section having a magnetic field strength in the range of substantially 350–450 Gauss.

BRIEF DESCRIPTION OF THE DRAWINGS

The above and other features and aspects of the present invention will become more apparent upon the reading of the following detailed description in conjunction with the accompanying drawings, in which:

FIG. 1 is a top view of the prior art Anelva PMC magnet assembly;

FIG. 2 is a cross-sectional view of a target after use with the prior art Anelva PMC magnet assembly;

FIG. 3(a) is a cross-sectional view of the prior art Anelva SPMC magnet assembly;

FIG. 3(b) is a top view of the prior art Anelva SPMC magnet assembly;

FIG. 4 is a cross-sectional view of the magnet assembly of the present invention;

FIG. 5 is a top view of the magnet assembly of the present invention;

FIGS. 6(a),(b)), and (c) are a top view, a side view, and an end view of the side magnet section of the magnet assembly of the present invention respectfully;

FIGS. 7 (a), (b), and (c) are a top view, a side view, and an end view of the ring magnet section of the magnet assembly of the present invention respectfully;

FIGS. 8 (a), (b), and (c) are a top view, a side view, and an end view of the center magnet section of the magnet assembly of the present invention respectfully;

FIG. 9(a) is a graph for the present invention showing the magnetic field strength in Gauss (measured 23.5 mm from the top of the magnet assembly) versus the distance from the center of the magnet assembly in inches for different angles of the magnet assembly;

FIG. 9 (b) is a graph for the prior art Anelva SPMC magnet assembly showing the magnetic field strength in Gauss (measured 23.5 mm from the top of the magnet assembly) versus the distance from the center of the magnet assembly in inches for different angles of the magnet assembly;

FIG. 10 is a top view of the magnet assembly of the present invention with the angles used in FIG. 9(a) shown thereon; and FIG. 11 is a group of cross-sectional views of the target and the plasma containment areas for different angles of the magnet assembly of the present invention.

The same structures in the different figures are labelled with the same number.

DETAILED DESCRIPTION OF THE PREFERRED EMBODIMENT

FIG. 4 is a cross-sectional view of the magnet assembly 31 of the present invention. FIG. 4 shows a center magnet section 30, ring magnet section 32, and a side magnet section 34, all mounted on a flat metal plate 33. This magnet assembly 31 is placed in a sputtering chamber and rotated about the center axis 44 of the magnet assembly 31. The side magnet section 34 is thinner than the ring magnet section 32 and center magnet section 30. In FIG. 4, a centerplane 35 bisects the side magnet section 34 through a plane parallel to plate 33 and a centerplane 37 bisects the ring magnet section 32 through a plane parallel to plate 33. Since the centerplanes are parallel to the plane of the metal plate 33 when the magnet sections are mounted on the metal plate 33, the centerplanes 35 and 37 are shown as lines in FIG. 4. Before the ring magnet section 32 and the side magnet section 34 are put together on the magnet assembly the centerplanes divide the positive and negative poles of the magnet sections. The side magnet section 34 is offset from the ring magnet section 32 such that the centerplane 35 does not match the centerplane 37. In the preferred embodiment, the centerplane 35 of the side magnet section 34 is about a quarter inch above the centerplane 37 of the ring magnet section 32. The use of a thinner side magnet section and the use of a side magnet section with its centerplane placed above or below the centerplane of the ring magnet section increases the asymmetry of the magnetic field thereby allowing for a more even erosion of the target when the magnet assembly is rotated.

FIG. 5 is a top view of the magnet assembly of the present invention. This shows the side magnet section 34, the ring magnet section 32, and the center magnet section 30. The ring magnet section 32 is symmetrical along a first axis 36 and a second axis 38. The magnet assembly is rotated about the center axis 44 perpendicular to the plane formed by the first axis 36 and the second axis 38. The first axis 36 and the second axis 38 are parallel to the plate 33 shown in FIG. 4. In the preferred embodiment shown in FIG. 5, the first axis 36 and the second axis 38 intersect with the center axis 44. Additionally, the ring magnet section defines a center area 40. The center magnet 30 is positioned asymmetrically with respect to the first axis 36. In the preferred embodiment, the center 42 of the center magnet is positioned 0.9 inches to the right of the first axis 36 the magnet assembly 31.

The side magnet section 34 is on one side of the first axis 36. This side magnet section 34 is attached to the ring magnet section 32. The side magnet section 34 and the ring magnet section 32 are oriented so that their north pole is on top. The center magnet section 30 is oriented so that its south pole is on top.

The magnets of the magnet assembly in the preferred embodiment are ceramic magnets. The preferred embodiment of the magnet assembly uses six ring magnets in the ring section, one side magnet in the side magnet section, and one center magnet in the center magnet section.

The present invention also concerns the use of a range of magnetic field strengths for the center and side magnets. The magnetic field strengths for the magnet sections are measured at the surface of the magnet sections on the top near the middle so that the magnetic field effects of the edge are minimized. The magnetic field strength of the side magnet is in the range 350-450 Gauss with a preferred range of 375-425 Gauss. The magnetic field strength of the center magnet is in the range 680-780 Gauss with a preferred range of 705-755 Gauss. The magnetic field strength of the ring magnet can be in the range 1350-1450 Gauss with a preferred range of 1375-1425 Gauss. The use of center, side and ring magnet sections with the above magnetic strength ranges increases the asymmetry of the magnetic field, thereby allowing for a more even erosion of the target when the magnet assembly is rotated. The use of these field strengths also can help allow for the magnet assemblies use with a 280 mm target.

FIGS. 6, 7 and 8 show further details of the side, ring, and center magnets of the preferred embodiment of the present invention. FIG. 6(a) shows a top view of the side magnet in the present invention. The magnetic field of the side magnet is substantially 400 Gauss. The short side of the side magnet is 7.04 inches long. The long side of the side magnet is 9.07 inches long. FIG. 6 (b) is a side view of the side magnet. The thickness of the side magnet is 0.4 inches. FIG. 6 (c) is an end view of the side magnet of the present invention. The width of the side magnet is 1.8 inches.

FIGS. 7 (a), (b), and (c) are views of the ring magnet section of the present invention. The ring magnet section is made of rectangular magnets 50 and 52, and curved magnets 54, 56, 60, and 62. The magnetic field of each rectangular magnet is substantially 1,400 Gauss. The magnetic field at the connection of the two curved magnets on either side is 1,400 Gauss. The length of the ring magnet section along the first axis 36 is about 10¾ inches. The length along the second axis 38 is about 8¾ inches. The thickness of the ring magnets is about 0.945 inches.

FIG. 8(a) is a top view of the center magnet of the present invention. The center magnet has a magnetic field of substantially 730 Gauss. The thickness of the center magnet is about 0.89 inches. Notice that the thickness of the side magnet is less than the thickness of the ring magnets and that of the center magnets. In the preferred embodiment, the thickness of the side magnet is less than one-half the thickness of the side or the center magnet.

FIG. 9(a) is a graph for the present invention of the component of the magnetic field strength that is perpendicular to plate 33 in Gauss versus the distance from the center of the magnet assembly measured at a number of different angles relative to the magnet assembly as shown in FIG. 10 described below. In FIG. 9(a), zero degrees is shown as a square, thirty degrees is shown as a triangle pointing up, sixty degrees is shown as a circle, ninety degrees is shown as a diamond, 120 degrees is shown as a triangle pointing downward, and 150 degrees is shown as an asterisk. This graph uses data gathered with the magnet assembly of the preferred embodiment described above. The magnetic field data is taken 23.5 mm above the magnet assembly at a position corresponding to the location of the surface of the target above the magnet assembly. The component of the magnetic field perpendicular to plate 33 is positive when the component of the magnetic field perpendicular to plate 33 is pointing up away from plate 33 and negative when the component of the magnetic field perpendicular to plate 33 is pointing down towards plate 33. The plasma tends to be contained at locations where the perpendicular component of the magnetic field switches from positive to negative. Notice that the furthest such switch occurs at about 6 or −6 inches from the center for the present invention. Additionally, the graph of the magnetic field is asymmetrical for different angles with respect to the magnet assembly so that the component of the magnetic field perpendicular to plate 33 switches from positive to negative at different positions along the radius of the target for different angles with respect to the magnet assembly. For this reason, the eroding action of the plasma reaches a greater area of the target and the target is more evenly eroded.

FIG. 9(b) is a graph for the Anelva SPMC magnet assembly showing the magnetic field strength in Gauss versus the distance from the center of the magnet assembly for the different angles of the magnet assembly. The magnetic field data for this graph is also taken 23.5 mm above the magnet assembly at a position corresponding to the location of the surf ace of the target above the magnet assembly. Notice that the perpendicular component of the magnetic field switches from positive to negative at a location 7 or −7 inches from the center of the magnet assembly. Since the plasma is contained at a location further from the center of the target with the Anelva SPMC magnet assembly compared to that with the magnet assembly of the present invention, the Anelva SPMC magnet assembly must use the larger 300 mm targets rather than the 280 mm targets.

FIG. 10 is a top view of the magnet assembly of the present invention showing the angles and the sign of the distance from the center of the magnet assembly. These angles correspond to the angles shown on the magnet field strength graph in FIG. 9(a).

FIG. 11 shows the plasma containment area for different angles of the magnet assembly. Notice that the plasma containment area varies around the target. As the magnet assembly rotates, the plasma containment areas 100 above the target 102 move around in such a fashion that the target is eroded evenly and no re-deposition occurs. The asymmetry shown in FIG. 9(a) allows for the plasma to sweep over different areas of the target, and therefore reduce uneven erosion areas on the target. Without asymmetry in the magnetic fields, the target is likely to be very unevenly eroded. A magnet assembly with a symmetric magnetic field would have the same plasma containment area for each angle and would therefore erode a ring area of the target beneath the plasma containment area quicker than other areas of the target as shown in the cross sectional view FIG. 2.

The use of the magnet assembly of the present invention gives a 25% increase in efficiency determined in cost per wafer over the Anelva SPMC magnet assembly. This efficiency benefit is due to more even erosion of the target and the ability to use the smaller 280 mm target.

Various details of the implementation and method are merely illustrative of the invention. It will be understood that the various changes of details may be within the scope of the invention, which is to be limited only by the appended claims.

What is claimed is:

1. A magnet assembly for a sputtering chamber comprising:
   a ring magnet section of a first thickness, said ring magnet section being symmetrical about a first axis and a second axis, said ring magnet section defining a center area;
   a center magnet section of a second thickness, said center magnet section located within the center area, said center magnet section located asymmetrically to said first axis; and
   a side magnet section within said center area attached to said ring magnet section and located on one side of the first axis, said side magnet having of a thickness less than said first and second thickness.

2. The magnet assembly of claim 1, wherein the thickness of the side magnet section is less than one-half of said first thickness and less than one-half said second thickness.

3. The magnet assembly of claim 1, wherein the ring magnet section, the center magnet section, and the side magnet sections are mounted on a plate and the side magnet section is offset from the ring magnet section so that a first centerplane defined as a plane parallel to the plate bisecting the side magnet section is not the same as a second centerplane defined as a plane parallel to the plate bisecting the ring magnet section.

4. The magnet assembly of claim 3, wherein the first centerplane bisecting the side magnet section is positioned about a quarter inch above the second centerplane bisecting the ring magnet section.

5. The magnet assembly of claim 4, wherein the length of the ring magnet section along the first axis is about 10¾ inches and the length of the ring magnet section along the second axis is about 8¾ inches.

6. The magnet assembly of claim 1, wherein the ring magnet section is elongated along the first axis.

7. The magnet assembly of claim 1 wherein said center magnet section, said ring magnet section, and said side magnet section are comprised of ceramic magnets.

8. A magnet assembly for, a sputtering chamber comprising:
   a ring magnet section symmetrical along a first axis and a second axis, said ring magnet section defining a center area;
   a center magnet section within the center area defined by said ring magnet section, said center magnet section located asymmetrically to said first axis, said center magnet section having a magnetic field strength in the range of substantially 680–780 Gauss; and
   a side magnet section within said center area attached to said ring magnet section on one side of the first axis of the ring magnet section, said side magnet section having a magnetic field strength in the range of substantially 350–450 Gauss.

9. The magnet assembly of claim 8, wherein said center magnet section has a magnetic field strength in the range of substantially 705–755 Gauss.

10. The magnet assembly of claim 9, wherein said center magnet section has a magnetic field strength of substantially 730 Gauss.

11. The magnet assembly of claim 8, wherein said side magnet section has a magnetic field strength in the range of substantially 375–425 Gauss.

12. The magnet assembly of claim 11, wherein said side magnet section has a magnetic field strength of substantially 400 Gauss.

13. The magnet assembly of claim 8, wherein said ring magnet section has a magnetic field strength in the range of substantially 1350–1450 Gauss.

* * * * *